United States Patent [19]
Jeppesen, III et al.

[11] Patent Number: 5,706,297
[45] Date of Patent: Jan. 6, 1998

[54] SYSTEM FOR ADAPTING MAINTENANCE OPERATIONS TO JTAG AND NON-JTAG MODULES

[75] Inventors: James Henry Jeppesen, III, Lake Forest; Bruce Ernest Whittaker, Mission Viejo, both of Calif.

[73] Assignee: Unisys Corporation, Blue Bell, Pa.

[21] Appl. No.: 518,948

[22] Filed: Aug. 24, 1995

[51] Int. Cl.[6] .................................................. G01R 31/28
[52] U.S. Cl. .................. 371/22.3; 371/22.31; 371/22.32; 395/183.06
[58] Field of Search .................. 371/22.3, 25.1, 371/22.1, 22.6, 22.31, 22.32, 22.34, 22.5; 395/575, 183.06, 183.08, 183.19; 364/580, 550; 324/765

[56] References Cited

U.S. PATENT DOCUMENTS

| | | | |
|---|---|---|---|
| 4,947,357 | 8/1990 | Stewart et al. | 371/22.3 |
| 4,947,395 | 8/1990 | Bullinger et al. | 371/22.3 |
| 5,115,435 | 5/1992 | Langford et al. | 371/22.3 |
| 5,412,260 | 5/1995 | Tsui et al. | 326/39 |
| 5,423,050 | 6/1995 | Taylor et al. | 395/575 |
| 5,428,623 | 6/1995 | Rahman et al. | 371/22.3 |
| 5,444,716 | 8/1995 | Jarwala et al. | 371/22.3 |
| 5,497,378 | 3/1996 | Amini et al. | 371/22.3 |

*Primary Examiner*—Robert W. Beausoliel, Jr.
*Assistant Examiner*—Nadeem Iqbal
*Attorney, Agent, or Firm*—Alfred W. Kozak; Mark T. Starr; Steven R. Petersen

[57] ABSTRACT

A digital system which normally initializes and tests non-JTAG logic units is adapted to test JTAG protocol compatible logic units. A JTAG translator unit provides an instruction control register and a Data Register. The Control Register has control bits for selecting Test-Mode-Select and Test Clock signals for the JTAG compatible units and Shift/Hold signals for the non-JTAG compatible logic units. The Data Register supplies diagnostic test bits to registers in both the JTAG and non-JTAG logic units. Additionally, the Control Register can initiate automatic incrementation of addresses to a control state RAM for rapid loading of microcode.

4 Claims, 10 Drawing Sheets

NOTE: THE VALUE SHOWN ADJACENT TO EACH STATE TRANSITION IN THIS FIGURE REPRESENTS THE SIGNAL PRESENT AT TMS AT THE TIME OF A RISING EDGE OF TCK.

SYSTEM FOR ADAPTING MAINTENANCE OPERATIONS TO JTAG AND NON-JTAG MODULES

BACKGROUND OF THE INVENTION

In recent years, it has been found desirable to initiate standards for embedding logic circuitry into integrated circuit chips and such developments have been proposed and developed by the IEEE committees which have defined a boundary scan architecture designated IEEE 1149.1 which is usable for maintenance and testing purposes. This boundary scan architecture involves placing a chain of registers around the periphery of integrated circuit logic in order to allow the device's input/output (I/O) to be controlled and observed by means of a four-wire serial scan bus. Thus, the registers associated with multiple circuit devices can be connected in series to form a complete path through all of the circuit devices, either completely within the integrated circuit chip, or can also be used for providing a serial scan on an entire printed circuit board holding integrated circuitry devices.

The proposed IEEE 1149.1 standards define operations allowing a sampling of boundary values during "normal operation" in order to observe data flow and also to select a scan bypass register to provide a single-bit scan path through a device. Thus, as seen in the attached FIG. 10, the IEEE standard provides an integrated circuit (IC) level test framework consisting of a four-wire Test Access Port (TAP) controller 7 and its related scan path architecture as shown in FIG. 10. The Test Access Port (TAP) controller 7 receives external control signals by means of a Test Clock (TCK) on line $7_k$ and also a Test Mode Select (TMS) signal on line $7_m$. It then provides output control signals to the internal scan paths.

Absent the requirement for embedded testability, the normal integrated circuit logic would be represented by the block 8 where data could be fed in on line $6_i$ and routed out on line $6_o$.

However by adding in the auxiliary embedded logic into the chip, it is then possible to provide "testability" of the chip or integrity in addition to being able to read out the various state conditions of each of the logic circuits 8. Thus, there could be a multiple number of integrated circuit logic circuits such as 8, each of which can be tested for integrity.

As seen in FIG. 10, the scan path architecture will be seen to have a single serial instruction register 10 and two or more serial data registers 15 and designated BSCAN (Boundary Scan). These Boundary Scan Registers (BSR) are the data registers which hold data which is input into or taken out of the integrated logic circuitry under test. Another register, register 16 is called the Scan Bypass Register.

Instruction register 10 and the Boundary Scan Data Registers 15 and 18 are connected in parallel between a serial Test Data Input signal line 5 (TDI) and a serial Test Data Output signal on line 25 (TDO).

The TDI input line 5 in FIG. 10 is connected directly to the serial inputs of the instruction register 10 and to the data registers 15 and 18. The Test Data Output (TDO) on line 25 can receive its signals from several sources, namely: From the instruction register 10, from the Bypass Register 16 via multiplexer $22_x$ and multiplexer $21_x$, or the Test Data Output line 25 may receive data from the boundary scan register 18 through the multiplexer $22_x$ and the multiplexer $21_x$.

The selective control signals for the multiplexer $21_x$ are supplied by the TAP (Test Access Port) controller 7. The selection control signals for the multiplexer $22_x$ will come from the instruction register 10.

When "boundary testing" is not being performed, the Boundary Scan Registers 15 and 18 are "transparent" and essentially out of the circuit, thus allowing the input signals and the output signals to pass to and from the various integrated circuit logic units 8.

However, during "boundary testing" in FIG. 10, the Boundary Scan Registers 15 and will "disable" the normal flow of data between the input $6_i$ and the output $6_o$ in order to allow boundary signals of the Integrated Circuit 8, to be controlled and observed by means of scanning operations. Thus, when there are multiple numbers of integrated logic circuits 8, each one of these circuits can have a snake chain which carries data through it.

Thus, there is provided the ability to sample data passing through the I/O boundaries of an integrated circuit or individual groups of integrated circuits, thus allowing the designers to take a snapshot of the logic states within the individual integrated circuit or within each one of a group of integrated circuits on a printed circuit board without removing the board from its mounting.

The concept involved here is often called "built-in testability" (BIT). Thus, by providing greater control and observability of the internal nodes in the normal logic circuitry 8, this allows the system to be tested much more efficiently with smaller test programs, shorter execution times and greater fault coverage. This type of efficiency can reduce the time and expense of test generation during the verification or de-bug process, thus allowing more rapid and reliable testing.

In addition to checking the hardware, the enhanced accessibility of the "states" of the internal nodes can simplify application software testing and hardware/software integration. Thus, software designers can use the Test Bus 5 in FIG. 10 (TDI) to download code in order to target various elements in the integrated circuit hardware and to monitor their response. With this increased observability, this makes it easier to sort out the hardware/software from integration problems. Thus, while many earlier systems required de-bug and testing to occur by means of pulling suspected printed circuit boards or suspected integrated circuit chips out of the system and putting in new ones in order to correct system problems in the field, in the presently described test system, the maintenance can be carried out internally and diagnostically, thus eliminating the necessity for carrying spare boards and spare integrated circuit chips which would be used for replacing defective boards and chips.

The designation JTAG refers to an architecture proposed by the joint Test Action Group (JTAG) which specifies a four-wire test bus and Boundary Scan architecture for embedding around the various logic circuitry units of an integrated circuit chip. This enables the linking of integrated circuit logic for enablement of testing and diagnostics. These types of built-in test features are specified in the IEEE Standard 1149.1.

In FIG. 10, the Test Access Port controller 7 is operable and steps-through various states or conditions which regulate various actions occurring during the test and diagnostics program. A typical example of these states is shown in FIG. 5.

FIG. 6 shows a typical situation of the prior art where a maintenance console will interface to a central processing unit module $10_a$ (CPM). It will be seen that the maintenance console interface $30_b$ to the on-card CPU maintenance interface $20_b$ provides for two general actions. These actions involve registers for (i) control and (ii) data. The console $10_b$ can shift data into a control register 40 which can set various maintenance modes as required. The console can also shift into a data register 50 using 16-bit groups of data. These data groups are shifted to and from the various CPU module shift chains.

FIG. 7 shows in greater detail the on-card maintenance interface $20_b$ to the console $10_b$ for the control register 40 and the data register 50. A portion of the control fields from the control register 40 are illustrated for exemplary purposes. For NON-JTAG maintenance operations, all that is required is for the console to set the "mode control" field of the mode control register $40_m$ to "hold" or to effectively stop the operational clocks to the normal CPU (10 nl) logic, FIG. 4.

The mode control field $40_m$ (FIG. 7) also selects a particular CPU shift chain via the "snake select" field $40_s$ of FIG. 7. The snake select field allows a Maintenance Console $10_b$ of FIG. 2, to select one of sixteen snake chains located on the CPU board. Each snake accesses different state information from the various logic sections on the board. Each snake is independent from each other, including the number of data bits contained in each snake. The console $10_b$ also sets up the total length of the selected snake in the "shift count" field $40_c$ (FIG. 8).

After this, the console $10_b$ simply shifts data into and out of the data register 50 (FIG. 7 and FIG. 8), and thus the selected CPU shift chain. The snake selected by the snake select field $40_s$ is attached to the data register 50 through data signals $21_{io}$ by external means as shown in module 28 of FIG. 7. Additionally, the console $10_b$ can, via the mode control field $40_m$, allow the issuance of CPU operational clocks to step the logic through various steps.

FIG. 7 further illustrates how the JTAG translation occurred under several of the prior-art methods. In this situation for JTAG operations, the signal Test Mode Select $40_t$ had to be manipulated to take the JTAG devices through the various "TAP" states as indicated in FIG. 5, which shows a typical state diagram for testing. The acronym TAP stands for the Test Access Port controller. The TAP (Test Access Port) steps through a series of protocol "states" for transition through the various protocol operations by the Test Mode Select (TMS) level at the rising edge of the Test Clock (TCK).

In this situation two control bits in the control register 40 assist in changing the TMS (Test Mode Select) signal on line 42. The control instruction register bit called TMS at $40_t$ in FIG. 7, can be set to a "zero" or a "one" by the console $10_b$. This value can be steered through the multiplexer 44 of FIG. 7 onto the actual TMS signal 42 to all of the JTAG devices such as module 26 of FIG. 3A. This method is used to provide a stable fixed value on the line 42 of the Test Mode Select signal (TMS).

Further, a string or pattern of "ones" and "zeros" can be subsequently put on the TMS signal line 42 via the data register 50 of FIG. 7 which was previously loaded by the console $10_b$. The control register bit called JTAG, at $40_g$ of FIG. 7, selects the multiplexer 44 to drive the data register onto the TMS signal on line 42 for this operation.

Referring now to FIG. 3A, it will be noted that the following steps are required to load microcode into the control store RAMs 28 with the use of prior art JTAG methods. These steps were required in the prior art:

(a) console $10_b$ to control register 40:—to select the snake for the processor 24 of FIG. 3;

(b) console $10_b$ to the data register 50:—place address value into processor 24 for the control store RAMs 28;

(c) console $10_b$ to control register 40:—set "JTAG" bits on; steer data register 50 to the TMS signal line 42;

(d) console $10_b$ to data register 50:—string pattern to JTAG devices 22 to "shift DR" (Data Read) state of TAP (FIG. 5);

(e) console $10_b$ to control register 40:—select JTAG device data snake; turn off "JTAG" bit;

(f) console $10_b$ to data register 50:—microcode word data value (accept the final data bit value);

(g) console $10_b$ to control register 40:—TMS bit, $40_t$ to TMS signal on line 42 for exit from "shift DR" state of TAP (FIG. 5);

(h) console $10_b$ to data register 50:—final bit value of microcode word;

(i) console $10_b$ to control register 40:—set 40 g "JTAG" bit on; steer data register 50 to the TMS signal on line 42 (FIG. 7);

(j) console $10_b$ to data register 50:—string pattern to JTAG devices 26 (FIG. 3A) to "Update" and then to "Idle" states of the Test Access Port (TAP), (FIG. 5);

(k) console 10b to control register 40:—set control $40_m$ mode control bit and counter $45_c$ to issue processor clock unit, 46 (FIG. 7);

(l) console $10_b$ to data register 50:—pseudo data and single processor clock issued; data written to RAMs 28;

(m) loop steps (a) through (l) for each one of the 32K microcode words.

In view of the complexities of the earlier art, the present JTAG translator system will be seen to quite considerably shorten the time for loading the 32K words of microcode into a control store RAM in a system which provides maintenance and test features for both the new JTAG compatible circuitry and for the older non-JTAG compatible circuitry.

SUMMARY OF THE INVENTION

The present invention describes a maintenance console which interfaces to a central processing module (CPM) which provides a control register for fine tuning in order to enable certain desirable actions to occur automatically.

The control register (40) provides a number of control bits which include the snake select bit $40_s$, the JTAG select bit $40_g$, the test mode select bit $40_t$, the shift count bit $40_c$ and the mode control bit $40_m$. A JTAG control logic block 44 (FIG. 8) which normally receives the snake select bit $40_s$, is additionally connected in order to intercept the JTAG select bit $40_g$ and the test mode select bit $40_t$.

As a result of this, an added influence is given to the unit 46 which is the "issue processor clock" unit. Because of this added sensitivity, the control block 44 provides "automatic features" in sensing actions that do not require any shifting of information from the console interface $30_b$ which would ordinarily operate as a slow, time-consuming action. The control block 44 functions to add in an "automatic handling" of the final bit of the microcode data value.

The final bit of microcode data referred to, is the last data bit being shifted into the selected snake. The last bit of data is shifted into the snake at the same time as the TAP (FIG. 5) transitions from "shift" to the "Exit 1" states.

The "automatic handling" refers to the Test Mode Select (TMS) being controlled directly by hardware instead of through the Maintenance Console $10_b$. It provides a string pattern to take the Test Access Port protocol (TAP, FIG. 5) to the "Update" state, then through the "Idle" and then back to the "Shift DR" state in addition to the automatic issuing of one processor clock after the shifting of the data value.

Additionally, by use of an automatic incrementation set of bits in the control register 40 and the addition of a new auxiliary address counter 52, there is provided a non-hardware addition which permits implementation in a programmable Xilinx device to facilitate the control store loading sequence and provide an additional reduction in the steps necessary for initialization and testing.

FIG. 3B is a simplified diagram showing the relationship of the JTAG Test Access Port controller 44 (FIG. 8) and its control over the Instruction Control Register 40 and Data Register 50.

Test data input on line $21_i$ is fed from the console $10_b$ into the instruction control register 40 and the data register 50.

A multiplexer $44_x$ of FIGS. 8 and 3B can be used to select control snake information from the instruction control register 40 or data snake information from the data register 50 according to selection on the MUX select line 44s from the JTAG Test Access Port controller 44.

The Test Data Output (TDO) on line $21_o$ is then fed to various components seen in FIG. 6 as for example, the non-JTAG components, the JTAG components and to all other components.

GENERAL OVERVIEW

A logic system may contain numerous blocks of hardware, each of which performs special functions required by the system operation. For example, a computer system will contain several logic modules which may include a central processing unit (CPU), memory modules, input/output units (I/O) and various other interface connection modules for the operating system. The system itself performs tasks that are specified for the users of the system. For example, the computer system may have the purpose of doing data processing and data communications as one example.

In addition to the required hardware and software modules used to accomplish the tasks required of the system, there will also be a special module of hardware and software that is required to "initialize" the system in order to get it started into proper operation. Very often this special "initialization module" will also be used to maintain and test the various system modules in order to diagnose and correct any inadequate operations in these modules. This disclosure is focused on the operations of the special initialization and maintenance-test functions of the central processing unit of a computer system.

Figure 1:
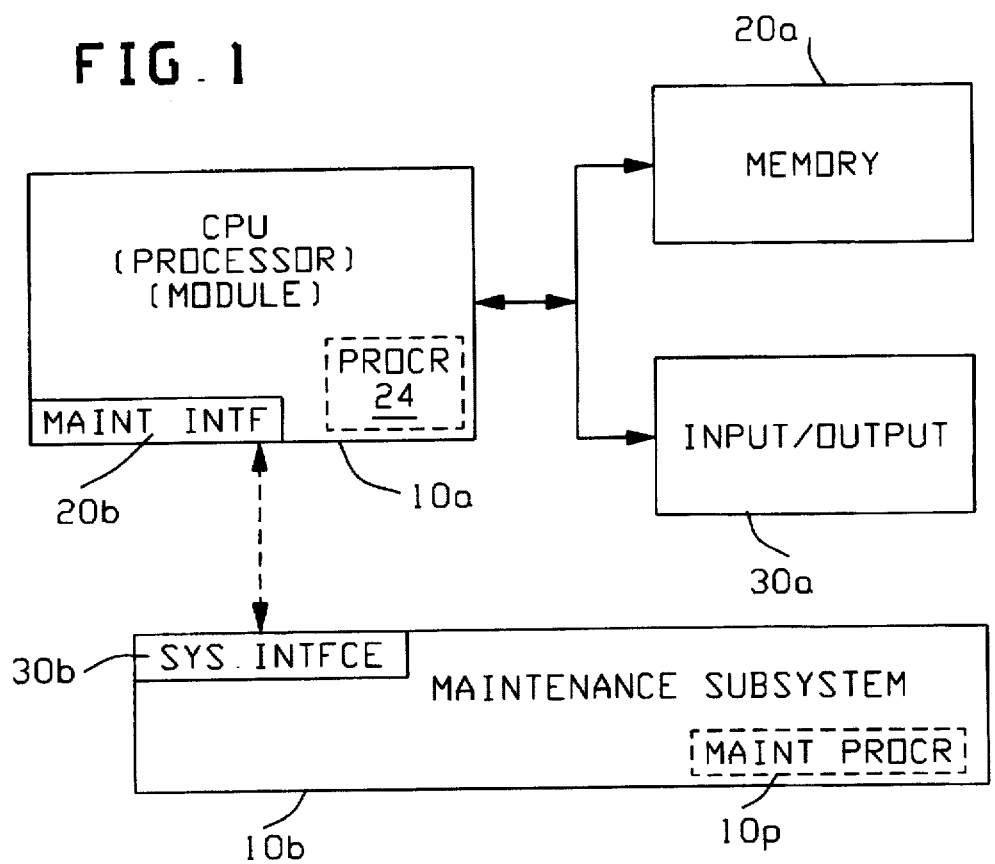
FIG. 1 is a block diagram of a basic computer system with a maintenance subsystem.

FIG. 1 is an illustration showing a block diagram of a basic computer system. The CPM $10_a$, the memory $20_a$ and the I/O unit $30_a$ perform the basic normal functions for the computer system. The maintenance console $10_b$ is a special block used to initialize and maintain the normal elements of this system. This block $10_b$ could be designated as the "maintenance and initialization" block.

Once the system is initialized and operating normally, the maintenance console $10_b$ has no part in the normal operation of the system. In FIG. 1, the solid line connections are shown to indicate those used in normal system operations. In FIG. 1, however, the dashed line connections are used only for initialization and maintenance.

In earlier systems, the maintenance connections were unique and customized to each system design since there was no industry standard. In some system designs, the maintenance interface $20_b$ may be used in parallel with other modules in the system. The maintenance hardware $10_b$ is not part of the normal operation of the system itself, and in essence, it is extra overhead hardware. It is thus desirable to minimize the maintenance hardware in cost and size. In most systems, the maintenance hardware will be a type of serial shifting data interface.

In recent time, there has been established an industry standard for this type of serial maintenance interface. This standard is designated as IEEE 1149.1. This standard is also referred as a "JTAG Interface" where the acronym "JTAG" refers to the Joint Test Action Group which formulated the protocol for a new standard maintenance interface. In the future, as more and more circuit elements, that is to say, Standard Integrated Chips, are available that support the JTAG system, then more and more systems will be designed as JTAG maintenance systems on an exclusive basis.

However, during this transition period, most existing systems are required to provide maintenance connections that support both (i) NON-JTAG (custom) interfaces and (ii) JTAG interfaces. This situation presents difficulties for the special subsystem modules such as indicated at $10_b$ in FIG. 1, since they must support both the JTAG type of hardware protocols and also support some other type of protocols which are NON-JTAG type hardware protocols.

The present disclosure presents a system for a high efficiency JTAG translation interface between the NON-JTAG type maintenance modules and the new JTAG type logic devices in a system.

Figure 2:
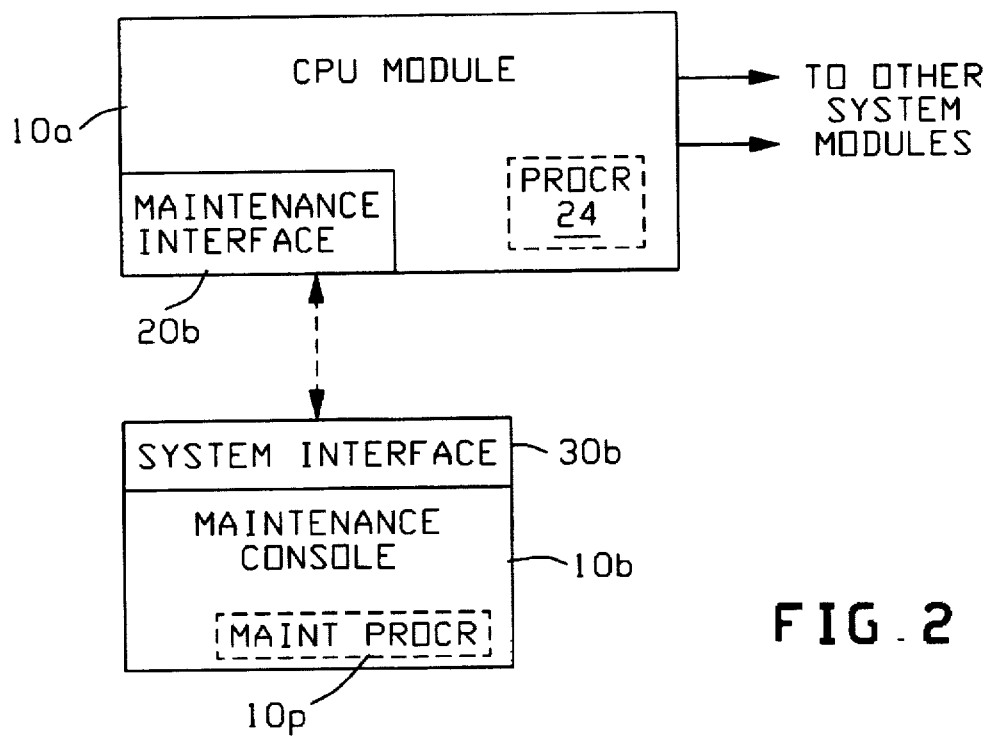
FIG. 2, is a drawing showing the maintenance interface connection for one of the system blocks shown in FIG. 1.

DESCRIPTION OF PREFERRED EMBODIMENT:

In reference to FIG. 2, there is shown the maintenance interface connection for one of the computer system blocks shown in FIG. 1. FIG. 2 shows a small portion of the CPU module, CPM $10_a$ as being required for the maintenance interface $20_b$. Further shown is the maintenance module which is often called the maintenance console $10_b$ and its interface $30_b$ to the CPU maintenance interface $20_b$. The system interface in the maintenance console $10_b$ is designated as $30_b$.

In pre-existing system designs, for example, such as the Unisys A-11 System Platform, the console $10_b$ and the connections to all of the normal system modules is a preexisting, well-established interface. This interface cannot be economically changed and is generally considered to be a fixed entity which must be used.

Now, it will be assumed that the CPU module, CPM $10_a$ is a new module to be inserted into the older fixed platform. On the so-called newer module, there are considered to be more JTAG compliant devices along with many older type of NON-JTAG devices. Thus, the maintenance interface $20_b$ of the CPU module $10_a$ must support both situations. It must continue to interface to the established NON-JTAG type interface $30_b$ of the console $10_b$, in FIG. 2, and additionally, it must interface to the new JTAG compliant devices such as JTAG registers 26 in FIG. 3A.

Maintenance Interface

The CPU module $10_a$ has many functions including hardware that must be maintained via the console interface $30_b$. For the sake of illustration, however, only the interface to the processor's control store RAMs 28 (FIG. 3A) will be discussed.

Figure 3A:
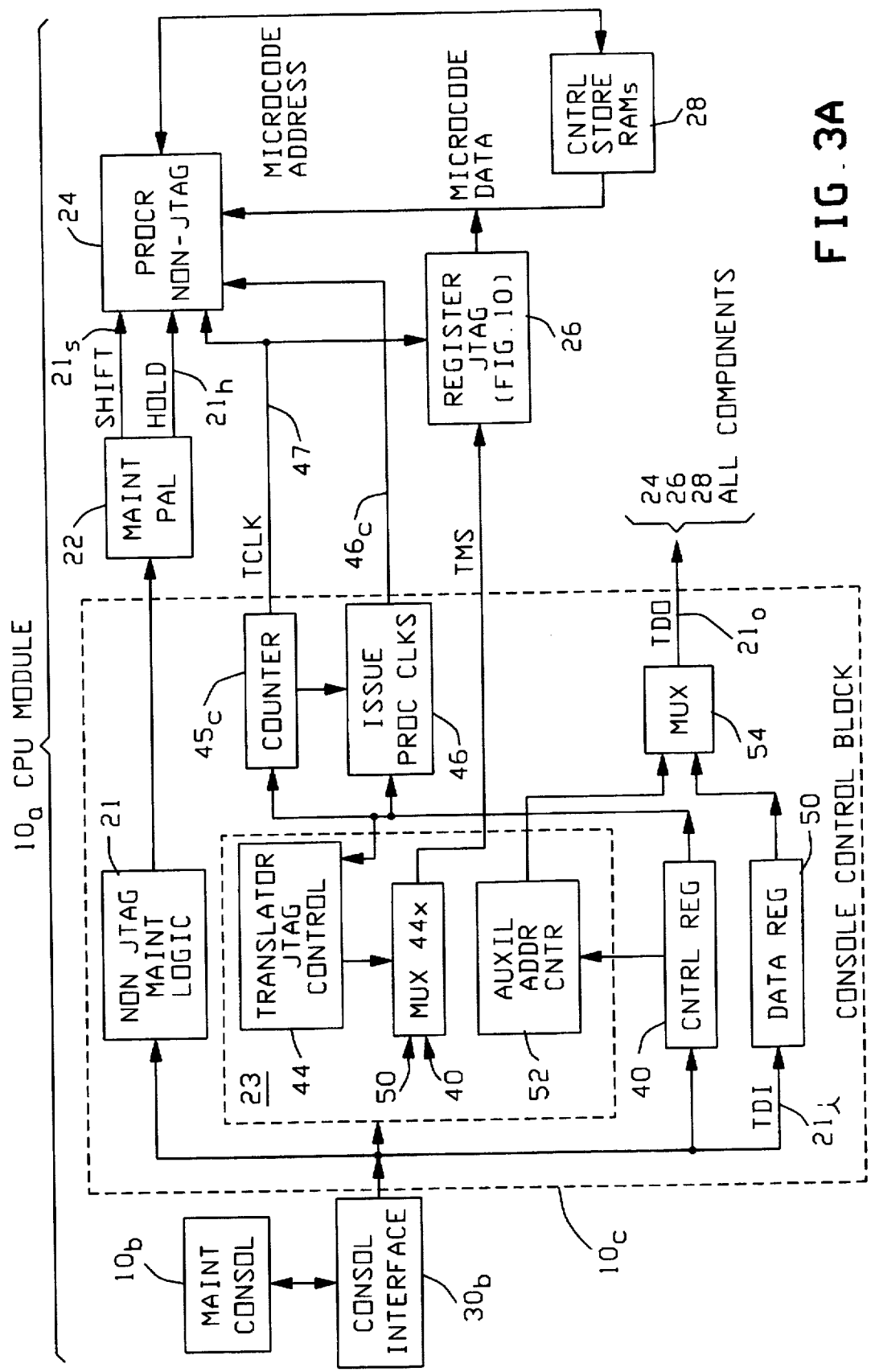
FIG. 3A is a drawing showing an extended view of the maintenance interface portion of the CPU module in addition to showing a portion of the normal CPU hardware used for the processor control store.
Figure 10:
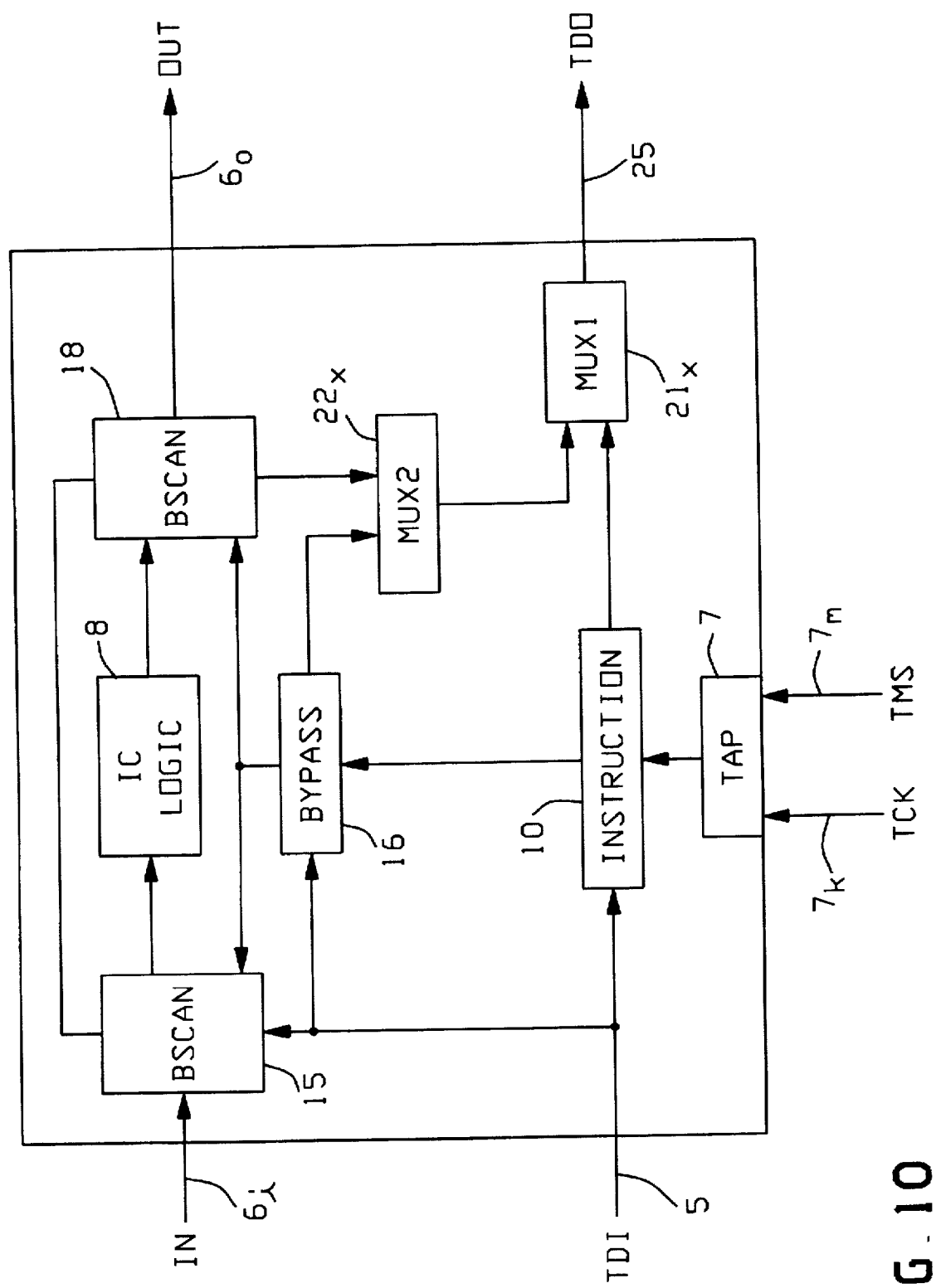
FIG. 10 shows an integrated circuit level framework consisting of test access port controller and related scan path architecture.

FIG. 3A shows an expansive view of the maintenance interface $20_b$ (of FIG. 2) portion of the CPU module $10_a$ and the Console Control Block $10_c$. FIG. 3A also shows a portion of the "normal" CPU hardware used for the processor control store RAMs 28. The control store RAM module 28 is not oriented to JTAG test conditions. On the other hand, the register store 26 is oriented to JTAG test conditions, and includes the circuitry typified in FIG. 10.

In FIG. 3A, the "normal" logic shown includes the processor 24, the control store RAMs 28 and an Intel "8374" Register Device 26. Of these elements, only the module 26 (Intel 8374) is JTAG compatible. In FIG. 3A, the various modules shown are discussed hereinafter in connection with FIGS. 8 and 9.

In the maintenance interface block $20_b$ of FIG. 3A, there are shown two programmable hardware blocks. One of these is called the Console Control Block $10_c$ and the other one is the Maintenance Programmable Array Logic (PAL) 22. The Console Control Block $10_c$ is seen to include an Instruction Control Register 40 and a Data Register 50 controlled by a Test Access Port Control 44 (translator JTAG Control) which is shown also in FIGS. 3B, 8 and 9.

Figure 3B:
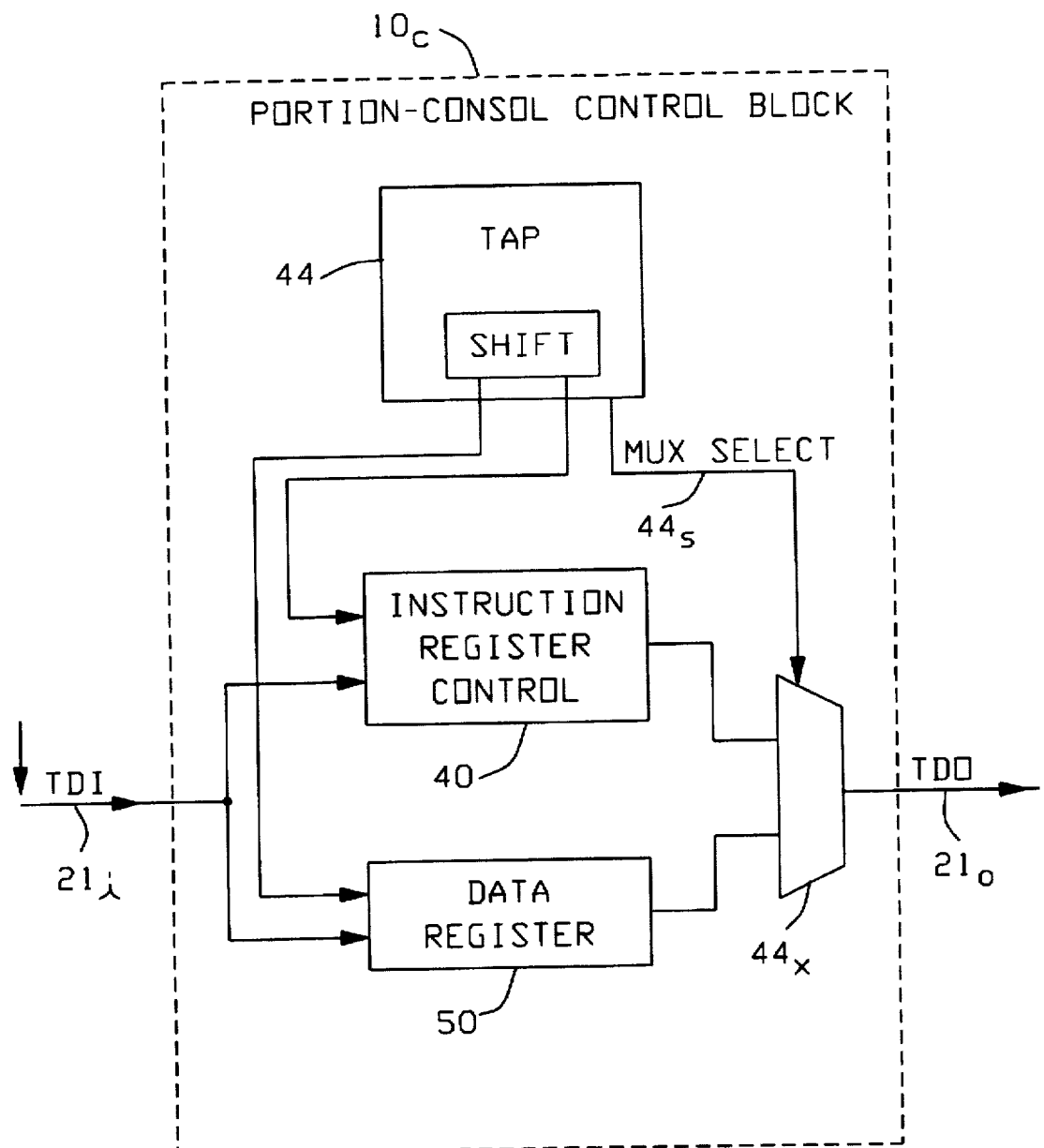
FIG. 3B is a drawing of a newly added JTAG Test Access Port Controller which responds to control bits in an Instruction register.

FIG. 3B is a diagram of a portion of the Console Control Block $10_c$ showing the relationship of the Test Access Port 44 (FIG. 8) and its control over the Instruction Control Register 40 and Data Register 50.

Test data input on line $21_i$, FIG. 3B, is fed from the console $10_b$ into the data register 50. A multiplexer $44_x$ can choose control snake information from the instruction control register 40 or data snake information from the data register 50 according to selection on the MUX select line $44_s$ from the Test Access Port controller 44.

Figure 6:
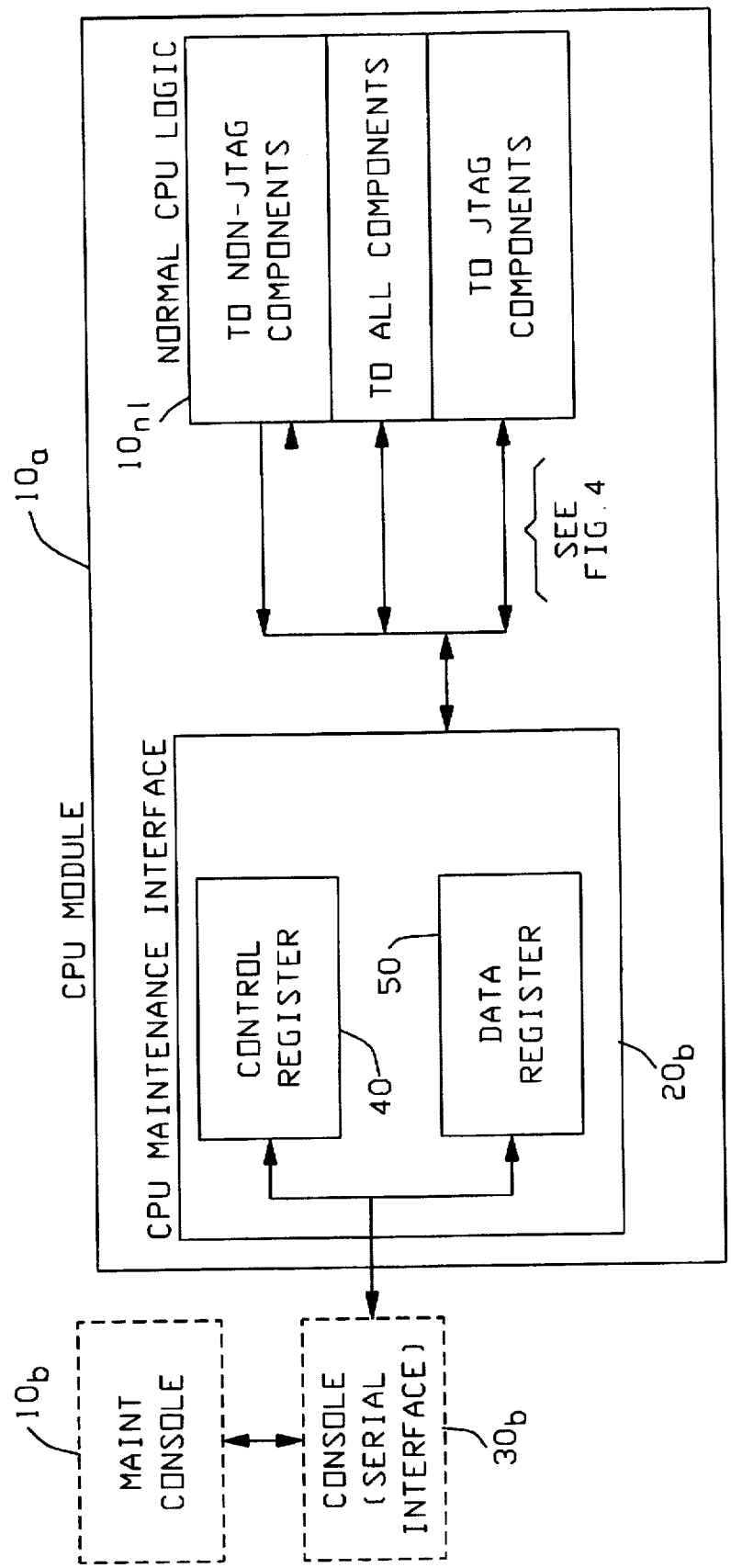
FIG. 6 is a simplified drawing of the relationship between the maintenance console and the central processing module to indicate the control register and the data register.

The Test Data Output (TDO) on line $21_o$ is then fed to various components seen in FIG. 6 as for example, the non-JTAG components, the JTAG components and to all other components, to form a diagnostic data output snake.

Figure 4:
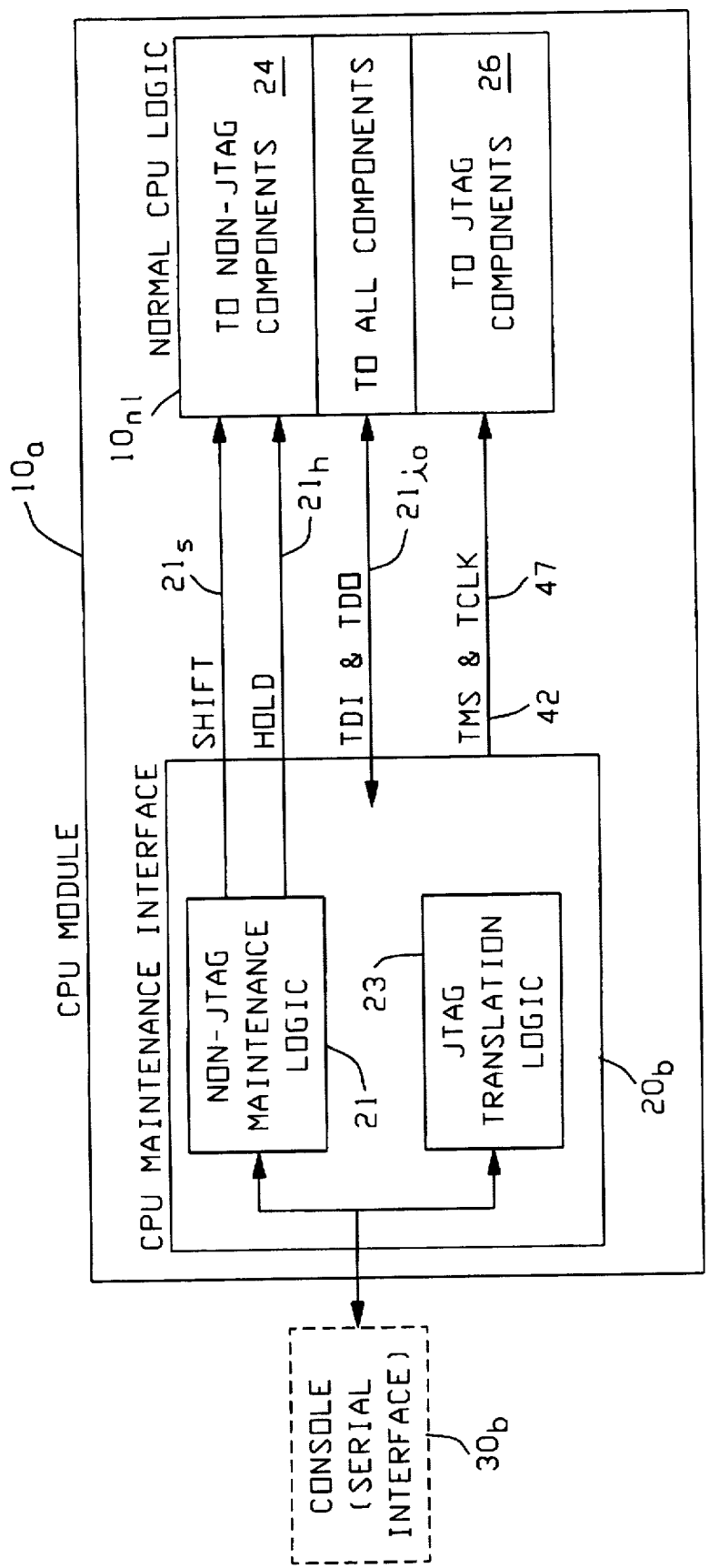
FIG. 4 is a drawing of a CPU module having a maintenance interface using non-standard maintenance logic.

In FIG. 4, there is shown the "Maintenance Interface" portion $20_b$ of the CPU module $10_a$ in a different orientation. Here, in FIG. 4, the delineation between the NON-JTAG 21 and the JTAG maintenance control 23 is illustrated.

Since the CPU module $10_a$ and the maintenance hardware were initially designed for use predominantly with the NON-JTAG maintenance circuitry, the maintenance interface logic $20_b$ on the CPU module $10_a$ would not be compliant with JTAG operations.

In FIG. 4, the maintenance interface logic $20_b$ is seen to have the non-JTAG-standard maintenance logic 21 and the JTAG translation logic 23. The non-standard maintenance logic 21 provides, on line $21_s$ and $21_h$, a shift/hold signal to the NON-JTAG components in addition to providing a test data input/output line $21_{io}$ to all the attached non-JTAG components. The JTAG translation logic 23 provides an output to all of the standard JTAG compatible components on lines indicated as TCLK 47 (test clock) and TMS 42 (test mode select).

There are six general signals shown in FIG. 4 in the CPU maintenance interface $20_b$ which are used for maintenance to the "normal" logic elements $10_{nl}$ within the CPU module $10_a$. Two of these signals are used only by the NON-JTAG units. These include the signals SHIFT $21_s$ and HOLD $21_h$. The other four signals are by necessity required by all of the "standard JTAG" item modules. The following Table I is a brief description of these signals.

TABLE I

| | |
|---|---|
| HOLD | (NON-JTAG) Freezes normal logic within module to be read by maintenance interface $20_b$. |
| SHIFT | (NON-JTAG) Causes data to be shifted into and out of circuitry via the TDI and TDO signals. |
| TDI | Test Data Input - serial shift data from the maintenance interface $20_b$ in a serial shift chain through all testable elements in the module |
| TDO | Test Data Output - serial shift data from the serial shift chain in testable elements back to the maintenance interface $20_b$. |
| TCLK | (JTAG only) Test Clock - shift clock for JTAG circuitry only. |
| TMS | (JTAG only) Test Mode Select control signal to all JTAG circuitry to control their test states. |

Figure 5:
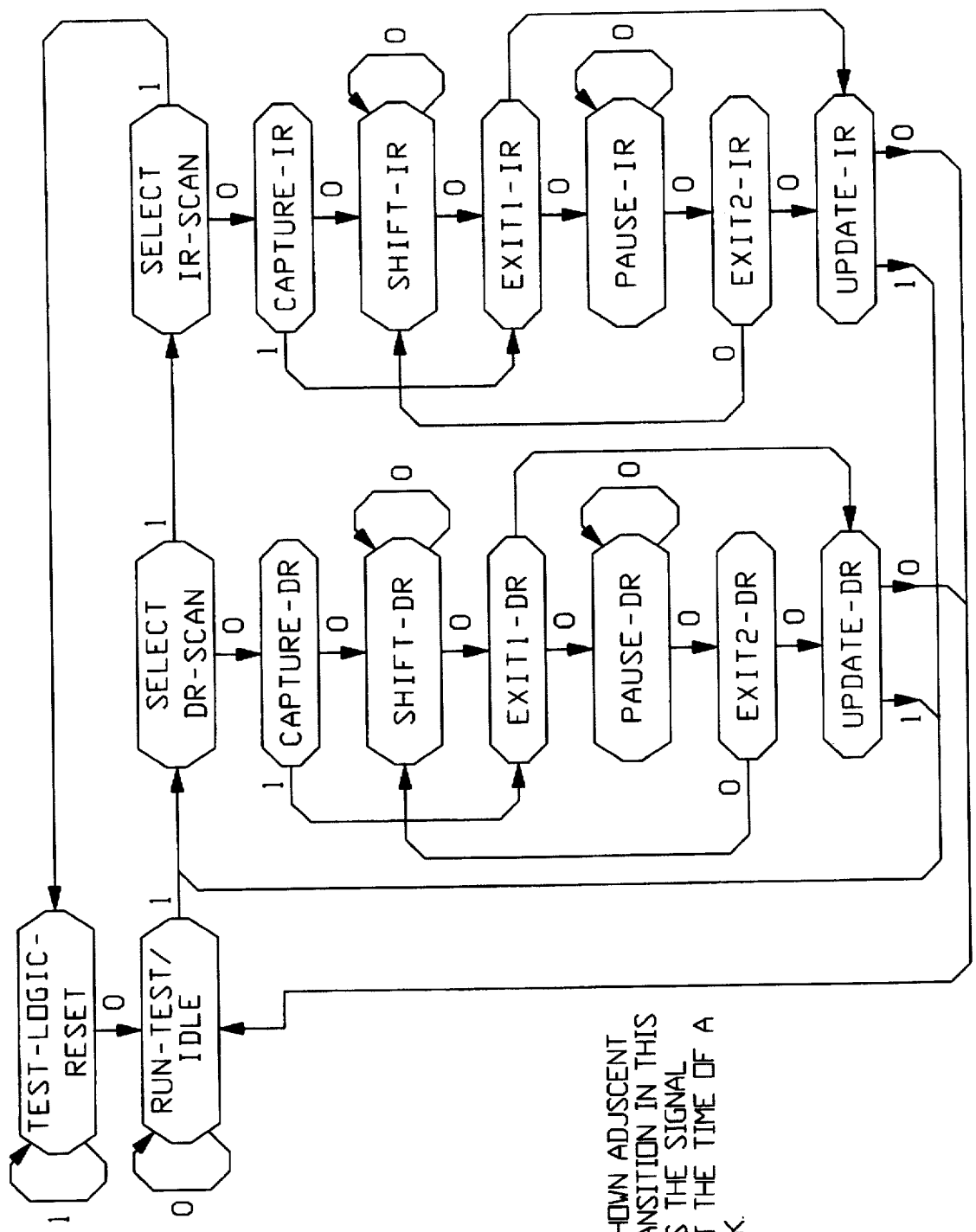
FIG. 5 is a standard Test Access Port controller (TAP) showing the state protocol involved in boundary scan diagnostic techniques.

The Test Mode Select signal on line 42 is driven from the maintenance translation block 23 and must transfer each JTAG element through the standard JTAG control sequence flow (FIG. 5). For reference purposes, FIG. 5 provides a typical illustration of the sequential protocol flow required for the various state transitions used in JTAG diagnostics.

The maintenance console interface $30_b$ via the JTAG translation control 23 will step the TMS signal (on line 42) either high or low in order to sequence all of the JTAG states through the sequence state diagram of FIG. 5. The TMS (test mode select) signal is changed and sampled on each rising edge of the TCLK (clock signal). For example, if the TMS signal is continuously high, then all the JTAG devices will go to and stay in the "Test-Logic-Reset" state. This is the non-maintenance, that is to say, normal operational state for all JTAG devices.

The following example will indicate how the TMS sequences and their states will operate (each TMS value shown implies a rising edge of TCLK):

TMS 1-1-1-1-1- . . . is the means of insuring that the TAP controller (FIG. 5) is in the "Test-Logic-Reset" mode.

Then the TMS sequence of:

```
TMS  1 - 1 - 0 - 1 - 1 - 0 - 0
     a   b   c   d   e   f   g
``` will shift the TAP states as shown below.

NOTE: Knowing the TAP is in the Test-Logic-Reset mode, the Test Mode Select signal pattern shown causes the following TAP state transitions:
a—Test-Logic-Reset
b—No Change
c—Run-Test/Idle
d—Select—DR-Scan
e—Select—IR-Scan
f—Capture—IR
g—Shift—IR NON-JTAG Maintenance Interface Operation The maintenance processor $10_p$ in console $10_b$ in FIG. 2 will cause maintenance operations to occur, for example, by running tests on initialization, on the CPU module $10_a$ by using the four NON-JTAG signal lines designated: HOLD, SHIFT, TDI (Test Data Input), and TDO (Test Data Output).

Firstly, the "normal CPU logic" ($10_{nl}$, FIG. 4) will be frozen in a logical state by the HOLD line. Then, information will be taken out of the CPU $10_a$ or else put into the CPU $10_a$ via the TDO and TDI lines, respectively. These lines TDO and TDI are shown in FIG. 3 and FIG. 4. The data transfer is in a serial format and is shifted when the SHIFT signal is active for the NON-JTAG version of maintenance.

JTAG Maintenance Interface Operation

The IEEE 1149.1 standard gives a very precise protocol by which the four JTAG interface signals ($21_i$, $21_o$, 42,47, FIG. 4) can be used for all JTAG compatible devices. The TMS (Test Mode Select) signal 42 is transitioned to sequentially step the devices under test into the appropriate states of the "TAP controller state diagram" shown in FIG. 5. Information can be shifted into and out of the JTAG devices over the TDI and the TDO lines ($21_i$ and $21_o$). Here the appropriate "state" will determine whether there is an instruction type or data type information operation.

Maintenance Translation

Since the on-card maintenance interface logic $20_b$ in the CPU module $10_a$ of FIG. 2, was already present prior to the addition of the newer type of JTAG components, then its design specializes in connecting to the "NON-JTAG" devices. However, for the system design to evolve and expand with the more modern industry developments using the newer JTAG type devices, these newer JTAG type devices may now be added into the module design. Thus, it is most desirable to not have to totally redesign the maintenance subsystem in this case since the maintenance subsystem is distributed over many different modules and requires extensive software support.

Thus, to provide both NON-JTAG maintenance and also the new JTAG maintenance while still using the same older style maintenance interface logic shown in FIG. 2, $20_b$, then a small "translation logic unit" 23 of FIG. 4 is added to the maintenance interface $20_b$ to provide for the JTAG signal protocol. Whether NON-JTAG type or the new JTAG-type components are being accessed must not make any difference to, nor must not appreciably change the software running the maintenance console $10_b$ and must not affect the interface $30_b$ between the console $10_b$ and the various card modules, such as memory $20_a$ and the I/O module $30_a$.

Flexible Maintenance Translation System

Figure 7:
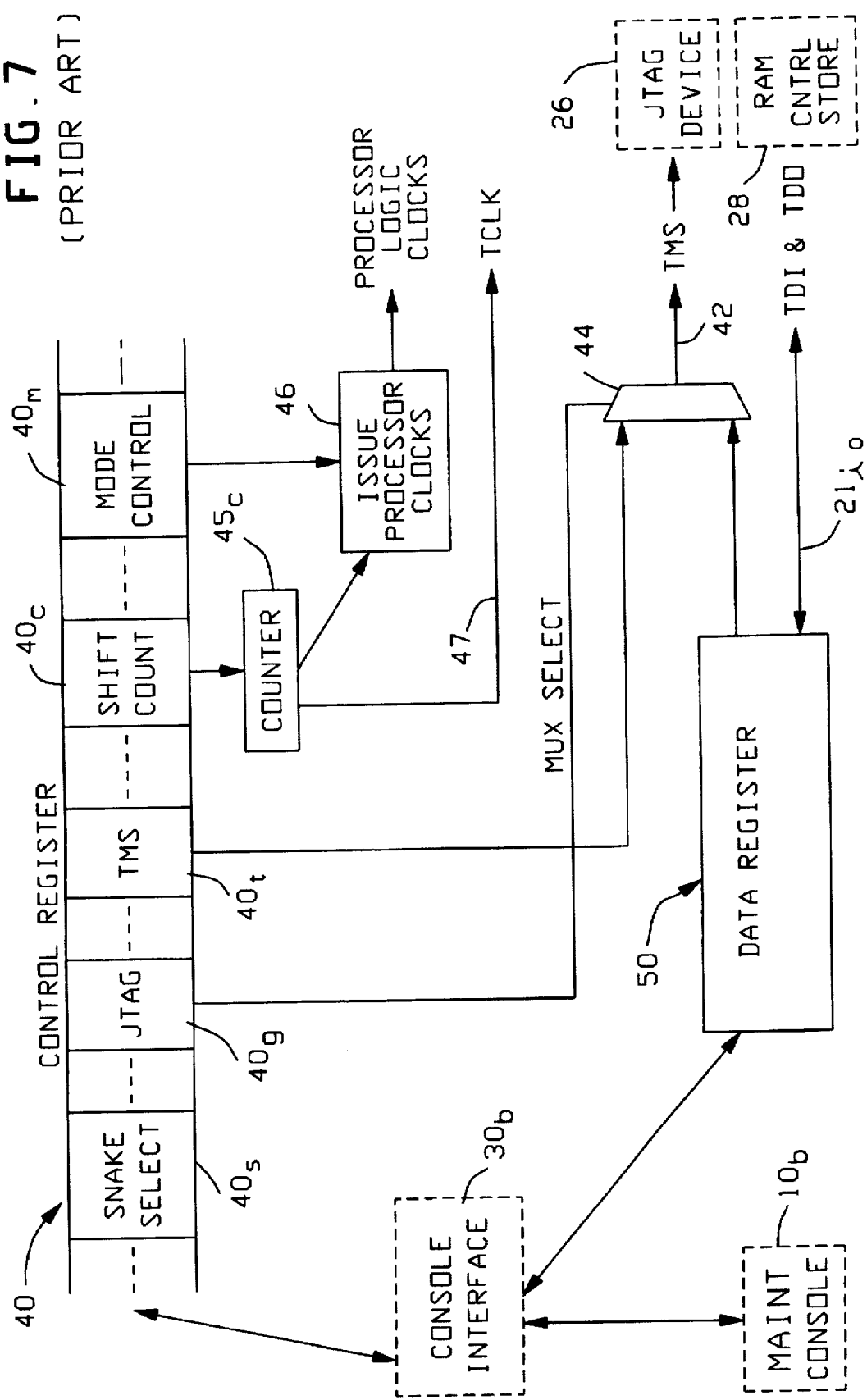
FIG. 7 is a drawing indicating how JTAG translation was provided for, under prior art methods.
Figure 8:
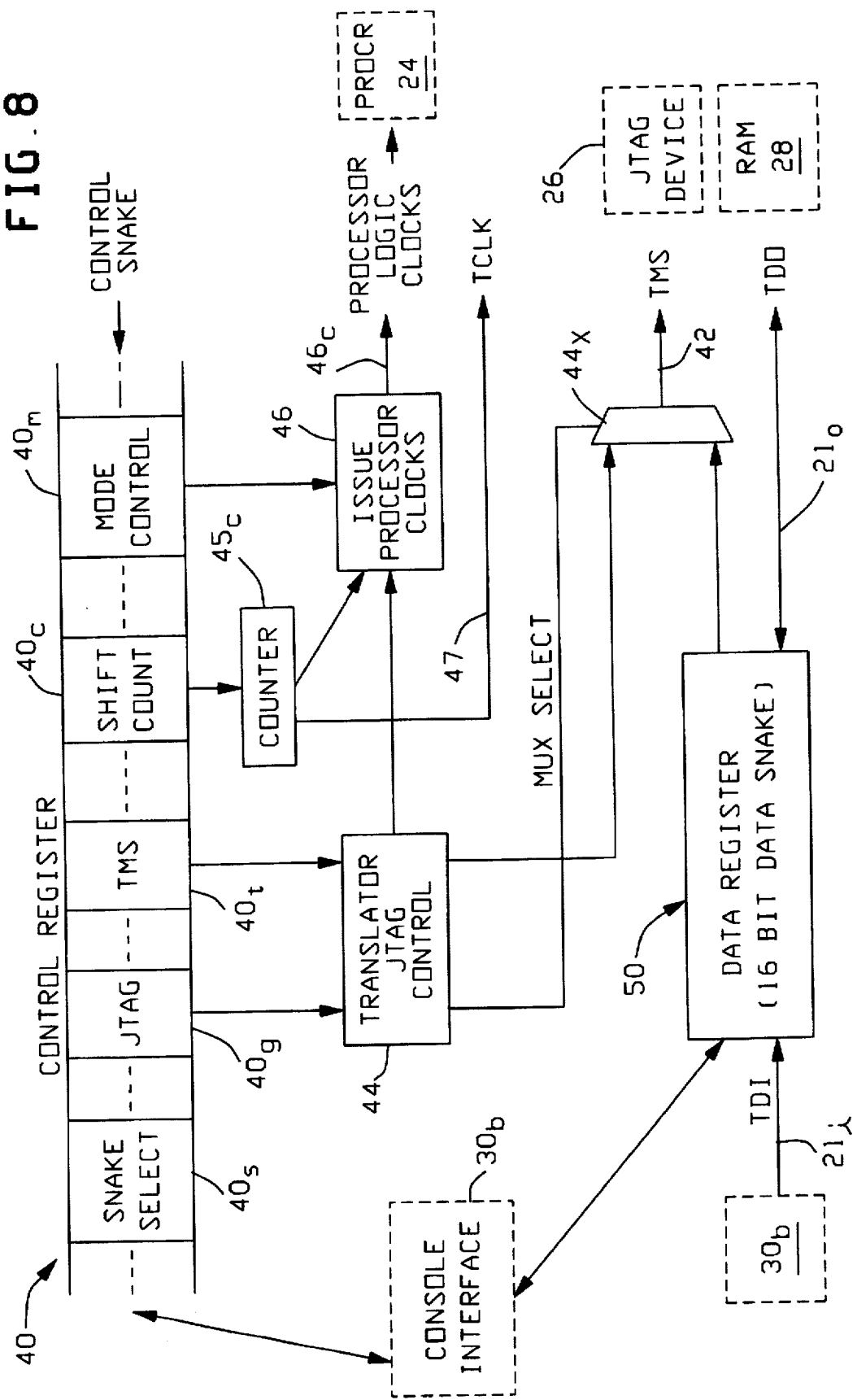
FIG. 8 is a drawing showing the maintenance console interface to the CPU module with newly added JTAG control for the Test Mode Select signal.

FIG. 8 shows the maintenance console interface $30_b$ connected to the CPU module $10_a$ with numerous changes in the operating configuration. By enhancing the system shown in FIG. 7 with the system shown in FIG. 8, it can be seen that the newly implemented JTAG control block 44 provides an added feature which intercepts and can control the two bits designated as the JTAG bit $40_g$ and the TMS bit $40_f$ from the control register 40. Further, this new control block 44 can also affect the clock issuance of a module designated as the processor clock unit 46. The new JTAG control block 44 also monitors the snake select field $40_s$ and only operates on certain selected JTAG snakes, that is to say, the "microcode data value snake."

The JTAG control block 44 adds certain new features which provide for several automatic actions to occur, that is to say, actions that do not require any shifting of information from the console $30_b$ which would involve a slow, time-consuming action.

The features provided by the JTAG control block 44 provide the following automatic functions:

(i) the final bit of the microcode data value is automatically handled;

(ii) a string pattern to take the Test Access Port protocol (TAP) over to the "Update" state and then through the "Idle" state and back to the "Shift DR" state;

(iii) the automatic issuing of one processor clock after the shifting of the data value.

Now referring to FIG. 3 (3A, 3B) will be seen that the following steps are required to load microcode into the control store RAMs 28 with the new system in FIG. 8 including the newly added JTAG method with result that a number of steps are eliminated as being unnecessary.

LOAD MICROCODE

The following steps indicate those required to load the microcode:

1. Console $10_b$ to instruction control register 40:—to select the processor snake;

2. Console $10_b$ to data register 50:—address value into processor 24 for the control store RAMs 28;

3. Console $10_b$ to control register 40:—to set "JTAG" bits on, then steer data register 50 to TMS signal;

4. Console $10_b$ to data register 50:—string pattern to JTAG devices to "Shift DR" state of TAP (FIG. 5);

5. Console $10_b$ to control register 40:—select JTAG device data snake, then turn off "JTAG" bit;

6. Console $10_b$ to data register 50:—microcode word data value (including final data bit value);

It should be noted that the following actions are not "automatic" without action from the console unit $10_b$.
(a) Complete data word is shifted, including final bit.
(b) TAP state transitions:—from "Shift DR" through "Update," through "Idle," and then back to "Shift DR."
(Now everything is ready to shift data again in the next operational loop.)
(c) Automatic issuance of single processor clock to write into the control store RAMs 28.

7. Operate to loop steps 1 through 6 for each word of the 32K microcode words.

Automatic Increment Address Value Operation

Figure 9:
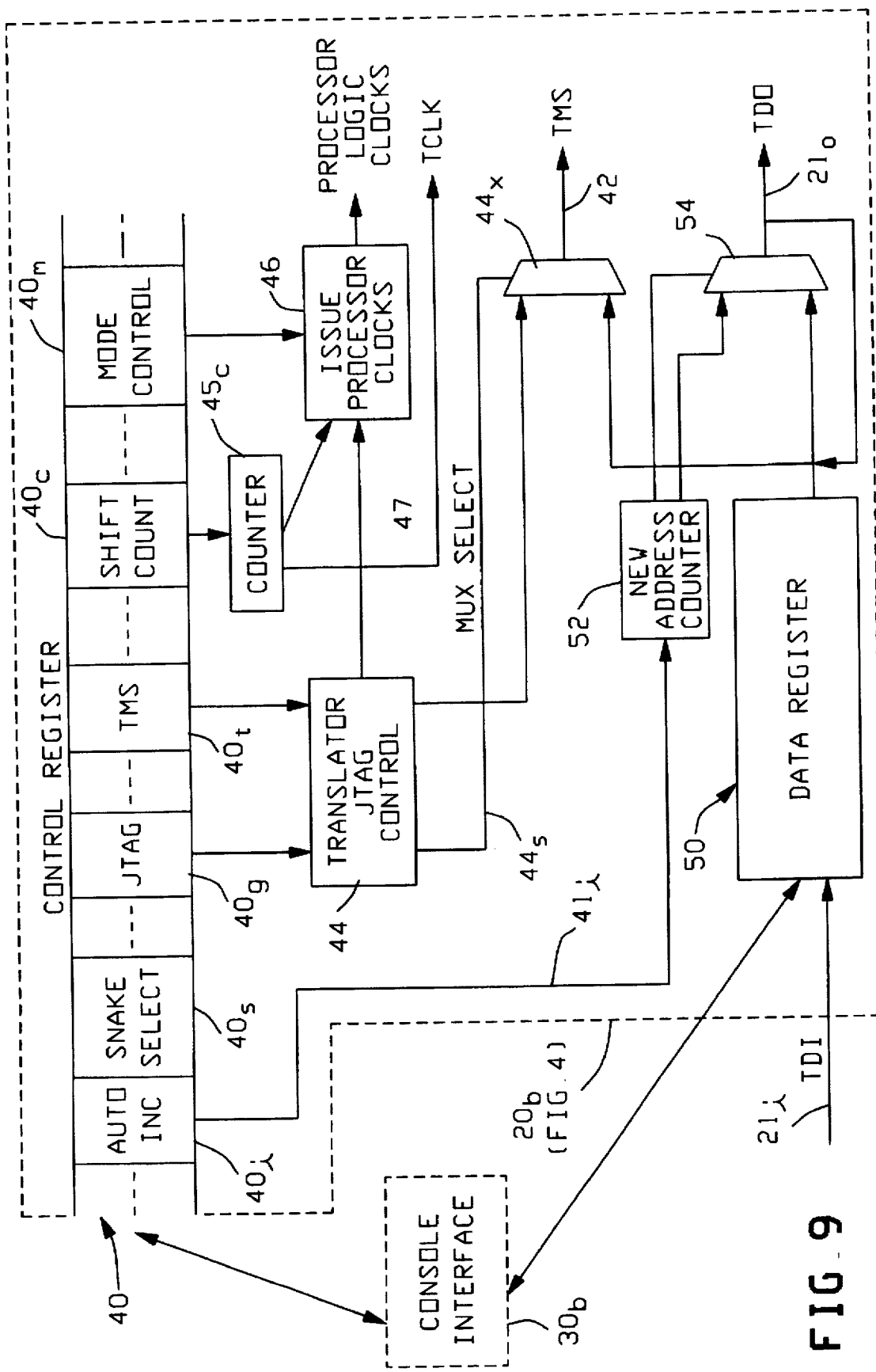
FIG. 9 shows the use of an added mode field, designated auto-increment, and a new-address counter which provides for automatic incrementing and transfer of address data to the RAM control store by eliminating involvement of the maintenance console.

Another feature of the present system enhances the efficiency of the maintenance structure and is indicated in FIG. 9. Here there is provided an additional mode field of two bits which is designated as $40_i$ and called "automatic incrementation." This is added to the control register 40.

Further in FIG. 9, there is added a new module 52 designated as the "new address counter" in combination with a multiplexer 54 which provides the tested data output line or TDO on line 21$_o$.

This new high efficiency enhances the maintenance loading of the control store RAMs 28. It may be noticed that in the discussion of the two operation loops 1 through 7 in the previous section, —that in order to load the control store RAMs 28, a new address value must be shifted into the central processing unit 24 for each one of the 32K words to be loaded in the RAMs 28. The shifting in of an address value for each word accounts for a large amount of additional maintenance overhead and thus there is "lost time" during the initialization.

The automatic incrementation bits 40$_i$ and the new address counter 52 allows for the "automatic" incrementing and the transferring of the address data values to the processor 24 without requiring a high overhead maintenance of the console 10$_b$. When the new mode field 40$_i$ is turned off (equal 00) by the console 10$_b$, then the Test Data Output line 21$_o$ operates identically to the previous system operations. Thus, the new multiplexer 54 is not switched to the new address counter block and only the data register 50 shifts onto the TDO line 21$_{io}$.

Now when the new mode bits for the "auto inc" signal 40$_i$(FIG. 9) are activated, then there is an additional source unto the Test Data Output line 21$_o$, which is namely the new address counter 52 which is now available. When the incrementation mode (40$_i$) bits are de-activated (equals 00), the new address counter 52 is held at a value of "0." One of the mode bits (equal 1x) enables this feature to operate. It allows the multiplexer 54 to insert the new address counter 52 into the test data output (TDO) stream. This allows the address counter 52 to also change values (increment) when instructed to do so. The console 10$_b$ will activate this bit of the mode field 40$_i$ at the beginning of the load control store operation and before entering the 32K loop.

Each time the console 10$_b$ desires that an address value be sent to the processor 24 to address the control store RAMs 28, the console 10$_b$ need only activate the second mode bit 40$_i$ as well (equal 11). It does this at the same time it shifts into the control register 40 to select via 40$_s$ the processor snake. When the second bit is activated, this new feature will automatically shift the present value in the new address counter over to the processor 24 snake through using the test data output line 21$_o$. After shifting out the present value, it will automatically increment the value in the new address counter 52. Then the console 10$_b$ must then de-activate the second mode bit (equal 10) before the feature will again respond to its value of being "on" (equal 11). The console 10$_b$ can then de-activate the mode bit when it shifts into the control register 40 to select the next snake that is needed.

Now referring back to the earlier discussion of the seven steps of the improvement using the high efficiency JTAG control unit 44, a further series of improvements will be indicated by use of the new address feature using the new address counter 52. The steps now involved are as follows:

(0) Console 10$_b$ to instruction control register 40:—this sets up the new mode bits (equal 10) and this step is only done once;

(1) Console 10$_b$ to control register 40:—this selects the processor 24 snake and sets the new mode bit in 40$_i$ (equal 11);
   (a) this action automatically sends out the address value;
   (b) this increments to the new address value and eliminates the need for the prior step 2 which was described under the earlier heading of "LOAD MICROCODE";

(2) Now, the former step 2 is no longer needed;

(3) Console 10$_b$ to control register 40:—will set the JTAG bit 40$_g$ "on": then steer the data register 50 to the test mode select signal TMS on line 42; then will de-activate the new mode bit in 40$_i$ (equal 10);

(4) Console 10$_b$ to the data register 50:—provide a string pattern to JTAG devices to get "shift DR" state of the Test Access Port (TAP) controller;

(5) Console 10$_b$ to the control register 40:—select the JTAG device data snake 40$_s$; then turn off the "JTAG" bit 40$_g$;

(6) Console 10$_b$ to the data register 50:—provide the microcode word data value (including final data bit value);

It should be noted that the following actions are now "automatic" and operate without need for the console 10$_b$ action:
   (a) the complete set of data words are now shifted, including the final bits;
   (b) the TAP state transitions will occur from "Shift DR" through "Update", through "Idle" and back to "Shift DR." Thus, everything is ready to shift again in the next loop;
   (c) provide automatic issuance of a single processor clock in order to write into the control store RAMs 28.

(7) Continue looping steps 1 through 6 for each of the 32K microcode words.

With the addition of the automatic increment bits and the use of the new address counter feature, the loop overhead is greatly reduced. Further, the substantial overhead of the console 10$_b$ maintaining a running address value and the process of shifting the address value from the console to the processor 24 and the need for incrementing, are now all automatically handled by the maintenance hardware in the processor card.

Described herein has been a flexible and versatile system for providing maintenance to systems which combine use of the newer JTAG devices and the older NON-JTAG devices. With the present system, it should be seen that the loop for loading the 32K words of microcode into the control store RAMs is quite considerably shorter and more efficient. The initialization prior art methods required approximately seven minutes to load the required microcode before actual system operation could take place. Obviously, this was an often unacceptable delay at initialization time for the system. The new flexible method has reduced this time to approximately one and one-half minutes which involves over a 400% decrease in the microcode loading time.

It may be also of value to note that the changes to this system are totally "soft." By this is meant that since the logic block of FIGS. 8 is implemented in Field Programmable Devices, such as developed by the Xilinx Corporation, it is only necessary to reprogram the Xilinx devices to implement the new system. The programming requires that a different PROM be used in the processor board in place of the previous one. It may be noted that the Xilinx devices are programmed from these PROM devices.

Thus, in order to achieve a hardware free efficiency feature and utilization of the JTAG translation function in a maintenance interface which also provides support to NON-JTAG circuitry, it is now possible to provide a faster and more efficient maintenance interface which is flexible in handling old and new components for maintenance and testing while also providing a more efficient initialization cycle.

While other implementations of the adapting JTAG system may be possible, it should be understood that the invention is encompassed by the following claims.

What is claimed is:

1. A system for providing initialization and maintenance testing of multiple digital modules, some of which are JTAG protocol compatible, and some of which are not JTAG protocol compatible, comprising:
   (a) maintenance processor means for initializing and test diagnosing a Central Processing Module;
   (b) said Central Processing Module including:
      (b1) a maintenance interface module connected to a series of multiple logic units;
      (b2) said multiple logic units including:
         (i) normally used logic units which are not compatible with JTAG protocol;
         (ii) multiple logic units which are compatible with JTAG protocol;
   (c) said maintenance interface means including:
      (c1) maintenance logic for serial shifting of a diagnostic data snakes through all of said non-JTAG protocol logic units with one continuous serial snake;
      (c2) JTAG translation logic for initiating the use of the JTAG protocol for testing of all of said multiple JTAG logic units with one continuous serial snake;
      (c3) an instruction control register means for providing control information for operating a JTAG control unit, a counter and an issue processor clock unit, including:
         (c3a) means for automatic incrementation of bits for transmission to a new address counter means including:
            (i) said new address counter means providing for the automatic incrementation of addresses to a control store RAM alternately between the delivery of instruction code initialization data from said maintenance logic to said control store RAM;
      (c4) a Data Register means for receiving Test Data Input for distribution to each of said JTAG protocol compatible and non-JTAG protocol compatible logic units;
      (c5) said counter means and said issue processor clock unit for generating clock signals in order to shift diagnostic data through said JTAG compatible and non-JTAG compatible logic units;
      (c6) said JTAG control means for selecting a test mode select signal for delivery to those multiple logic units which are compatible with the JTAG protocol.

2. A system for adapting the maintenance diagnosis of non-JTAG protocol compatible logic units in a Central Processing Module for testability of associated JTAG protocol compatible logic units, said system comprising:
   (a) maintenance logic means for shifting and holding diagnostic data from a maintenance console subsystem to non-JTAG compatible logic units for circulating said test data via a serial snake through said non-JTAG compatible logic units and return of said data to said maintenance console subsystem for diagnosis with one continuous serial snake;
   (b) JTAG translation logic means connected to said maintenance console subsystem for shifting diagnostic data to JTAG protocol compatible logic units for the diagnostic testing, via a serial snake, of said JTAG protocol compatible logic units and for transmitting said test data back to said maintenance console subsystem with one continuous serial snake;
   (c) said maintenance console subsystem for initiating said maintenance logic means and said JTAG translation logic means;
   (d) wherein said maintenance logic means and said JTAG translation logic means includes:
      (d1) control register means providing a series of control bits which include:
         (a) snake selection bits for selecting a particular data path for transfer of diagnostic data;
         (b) a JTAG control bit for initiating a JTAG Test Access Port controller for initiating the JTAG testing protocol to JTAG-compatible logic units;
         (c) a bit for initiating the Test Mode Select signal to JTAG-compatible logic units;
         (d) a shift-count set of bits for setting a counter and processor clock generator to issue the appropriate number of processor clocks for transfer of diagnostic test data;
         (e) mode control bits for enabling the generation of processor clocks to non-JTAG-compatible logic units and for issuing test clocks for JTAG-compatible logic units;
         (f) automatic increment control bits for initiating a series of incrementing addresses to a control store RAM means for loading microcode into said RAM means; and
      (d2) Data register means for receiving test data from said maintenance console subsystem and for distributing said test data either to said JTAG-compatible logic units and/or to said non-JTAG-compatible logic unit;
   (e) automatic address counter means connected to said auto increment control bits for selecting and incrementing addresses of said control store RAM means to enable microcode data to be loaded in each one of said incremented addresses.

3. A method for the adaptation of a non-JTAG computer system into a dual functioning maintenance diagnostic operation useable for non-JTAG logic units and JTAG logic units, comprising the steps of:
   (a) enhancing an instruction control register with control bits for selection of a specific snake path, selection of the JTAG protocol for initiating the Test Mode Select and Test Clock signals for transmission to JTAG compatible logic units; selection of the shift count for a counter means, and selection of mode control bits for controlling the number of processor clocks to be implemented, plus initiation of Shift/Hold signals for passing test data in a continuous serial snake to said non-JTAG compatible logic units;
   (b) initiating a JTAG Test Access Port controller from said JTAG select signal and said Test Mode Select signal, for circulation of test data to said JTAG compatible logic units with one continuous serial snake;
   (c) selecting the Test Mode Signal from said JTAG Test Access Port controller for transmitting the Test Mode Select signal to said JTAG logic units;
   (d) selecting the output of diagnostic test data from a Data Register for transmission to said JTAG protocol compatible logic units and to said non-JTAG compatible logic units;
   (e) capturing the data circulated through said JTAG compatible logic units with one continuous serial snake and said non-JTAG compatible logic units with one continuous serial snake for diagnosis by a maintenance processor means.

4. A method for enabling the maintenance and initialization of a non-compatible JTAG protocol series of logic units in a Central Processing Module, having a control store RAM and a processor which is not JTAG compatible, for capability of functioning with JTAG protocol-compatible logic units in said Central Processing Module, comprising the steps of:

(a) selecting a logic unit in said Central Processing Module for test and diagnosis using a snake select bit from a control register;

(b) initiating a plurality of bits for an automatic increment mode signal to an auxiliary automatic address counter which succeedingly increments the address of microcode data to enable the processor to select the control store RAM addresses so data from a data register can be placed in said control store RAM of said Central Processing Module;

(c) setting a JTAG control bit "on" in order to steer test data from a data register to be transmitted to said JTAG-compatible logic unit for transmission to a control store RAM;

(d) turning "off" said JTAG control bit after transmission of microcode data to said selected JTAG-compatible logic unit;

(e) transmitting microcode data to said control store RAM;

(f) issuing one clock to cause said processor to write data from JTAG registers to addresses selected by said processor, into the said control store RAM;

(g) repeating the above sequence of operations until all of the required microcode words are stored in said control store RAM.

* * * * *